United States Patent [19]

Baldwin et al.

[11] Patent Number: 4,509,096
[45] Date of Patent: Apr. 2, 1985

[54] CHIP-CARRIER SUBSTRATES

[75] Inventors: Graham J. Baldwin, Cheltenham; Michael O. McCann, Wotton-Under-Edge, both of England

[73] Assignee: Smiths Industries Public Limited Company, London, England

[21] Appl. No.: 578,924

[22] Filed: Feb. 10, 1984

[30] Foreign Application Priority Data

Feb. 22, 1983 [GB] United Kingdom ............ 8304890

[51] Int. Cl.³ ................................................ H05K 7/20
[52] U.S. Cl. ............................... 361/386; 174/16 HS; 357/80; 357/81; 361/387; 361/403
[58] Field of Search .......... 361/386, 387, 403, 400, 361/413; 174/68.5, 16 HS; 357/81, 80, 82

[56] References Cited

U.S. PATENT DOCUMENTS

| 3,777,220 | 12/1973 | Tatusko et al. ............ 361/386 |
| 3,969,754 | 7/1976 | Kuniya et al. ............ 361/386 |
| 4,189,524 | 2/1980 | Lazzari ............ 174/68.5 |
| 4,413,308 | 11/1983 | Brown ............ 361/403 |
| 4,420,767 | 12/1983 | Hodge et al. ............ 357/81 |

FOREIGN PATENT DOCUMENTS

| 241316 | 7/1979 | France ............ 361/386 |
| WO81/13734 | 12/1981 | PCT Int'l Appl. . |
| 821830 | 9/1959 | United Kingdom ............ 357/81 |
| 1156434 | 6/1969 | United Kingdom . |
| 1178566 | 1/1970 | United Kingdom . |
| 1194172 | 6/1970 | United Kingdom . |
| 2097998 | 11/1982 | United Kingdom . |
| 2062971 | 9/1983 | United Kingdom . |
| 2120860 | 12/1983 | United Kingdom . |

OTHER PUBLICATIONS

Tiffany "IBM Technical Disclosure Bulletin", vol. 13, No. 1, Jun. 1970, p. 58.

Primary Examiner—A. D. Pellinen
Assistant Examiner—Gregory D. Thompson
Attorney, Agent, or Firm—Pollock, Vande Sande and Priddy

[57] ABSTRACT

A substrate for a leadless chip carrier is formed on a rigid multi-layer circuit board. Layers of copper-clad invar are secured to opposite sides of the board, and on top of these are mounted respective layers of elastomeric material. An electrically-conductive layer is laid on top of the upper elastomeric layer and this is formed in a pattern of contact elements, and tracks which may be of dog-leg shape and which are interconnected to other layers of the substrate by plated holes. The chip carrier is supported on a heat transfer pad of copper which rests on the upper invar layer and is secured thereto by a layer of solder. The pad may have an integral pillar that extends through a copper-plated aperture in the substrate to a heat-dissipating pad on the surface of the lower elastomeric layer. Contact pads on the chip carrier are soldered to the contact elements, the height of the heat-transfer pad being such as to separate them and ensure a thick solder joint. The solder joints and the solder under the heat-transfer pad apply a force urging the carrier into close contact with the pad. Heat is conducted away from the underside of the carrier by the pad to the top invar layer, or, where the pad has a pillar, also to the lower invar layer and the heat-dissipating pad.

11 Claims, 3 Drawing Figures

CHIP-CARRIER SUBSTRATES

BACKGROUND OF THE INVENTION

This invention relates to chip-carrier substrates.

The invention is more particularly concerned with leadless chip-carrier substrates.

With the increasingly large scale of integrated electronic circuit chips the number of input and output connections that have to be made to the chip has correspondingly increased. This has resulted in a move away from dual in-line chip housings, in which two rows of connection pins are mounted on opposite sides of the chip housing, to leadless chip carriers. Leadless chip carriers usually comprise a square plate of ceramic, such as alumina, on which the chip is mounted. Electrical connection to the carrier is made by plated metal contact pads formed around each side of the carrier. The carrier is surface mounted on a printed-circuit board or substrate simply by placing the carrier on top of corresponding contact pads formed on the board or substrate and making electrical and mechanical connection by soldering. This arrangement is less cumbersome than that by which dual in-line housings are mounted on a board and allows for a greater density of input and output connections.

Disadvantages do, however, arise with leadless chip carriers because of the way in which they are connected to the substrate. Unlike dual in-line housings where connection is made through relatively flexible pins, the leadless carrier is rigidly joined to the substrate, lacking any ability to accommodate relative movement between the carrier and the substrate. If the carrier and the substrate are of materials having different coefficients of thermal expansion, change in temperature will cause differential thermal expansion between the two components. This leads to strain on the soldered connections which can, especially after repeated thermal cycling, cause failure of the connection, and in severe cases can cause the carrier to become detached from the substrate. Attempts have been made to match the thermal expansion properties of the carrier and substrate but, even when the two parts are of identical material it does not completely overcome the problem because the carrier and the substrate may not be at the same temperature. This is a particular problem where the assembly is repeatedly subjected to temperature differences as a result of the thermal energy that is dissipated by the semiconductor components in the carrier.

Various other arrangements have been proposed to reduce the effect of temperature differences on the mounting of leadless carriers but these have not yet proved successful in entirely overcoming the problem.

BRIEF SUMMARY OF THE INVENTION

It is an object of the present invention to provide a chip-carrier substrate that can be used to alleviate the above mentioned problems.

According to one aspect of the present invention there is provided a chip-carrier substrate for supporting and providing electrical interconnection with a chip carrier, including a rigid or semi-rigid multi-layer circuit board, at least one metal heat-dissipating layer, and a metal pad arranged for thermal contact with both the heat-dissipating layer and a face of the chip carrier, so that heat dissipated by the chip carrier is conducted via the pad to the heat-dissipating layer.

The heat-dissipating layer may be located on the upper side of the board, closer the chip carrier. The pad may include a heat-conducting pillar that extends within an aperture through the board, the substrate including a heat-dissipating layer located on the lower side of the board remote from the carrier, and the pillar being in thermal contact with the lower layer. The pad may include a head portion of larger cross-section than the pillar, and the head portion may be in thermal contact with the heat-dissipating layer on the upper side of the board. The aperture through the board may be coated with metal, and a layer of solder may be provided between the pillar and the metal coating. The substrate may include a layer of elastomeric material on the lower side of the substrate, the pillar extending through the lower layer of elastomeric material, and a heat-dissipating layer being formed on the lower surface of the lower layer of elastomeric material in thermal contact with the pillar. The substrate may include a layer of electrically-conductive material on its upper surface, to which electrical connection of the chip carrier can be made, and the metal pad projecting above the layer of electrically-conductive material so that the chip carrier can be supported by the pad in a spaced relationship above the layer of electrically-conductive material. The metal pad may be supported by a heat-dissipating layer on the upper surface of the board by a layer of solder or other heat-flowable material, and electrical connection of the chip carrier with the layer of conductive material may be made with solder, so that when the solder is heated, the flow of the solder urges the metal pad against the chip carrier. The substrate may include a layer of elastomeric material on the upper side of the substrate, closer to the carrier, and a layer of electrically-conductive material on the upper surface of the elastomeric layer. In this respect, the substrate may include conductor elements rigidly mounted with the board, the layer of electrically-conductive material including elongate tracks and contact elements to which the chip carrier can be connected, the tracks extending from the contact elements to the conductor elements, and at least some of the tracks being bent in the plane of the substrate at a point along their length so as to accommodate displacement towards and away from the conductor elements. The metal pad may be of copper, and the or one of the heat-dissipating layers may be of a copper-clad invar material. The substrate may be of substantially symmetrical construction across its thickness, both the upper side and the lower side of the board having a heat-dissipating layer mounted on the board, a layer of elastomeric material mounted on the respective heat-dissipating layer, and a layer of electrically-conductive material mounted on the respective elastomeric layer. The board may be of substantially symmetrical construction across its thickness.

According to another aspect of the present invention there is provided a chip-carrier substrate assembly comprising a chip-carrier substrate according to the one aspect of the invention, and one or more chip carriers mounted thereon.

A chip-carrier substrate assembly comprising a chip-carrier substrate and a chip-carrier in accordance with the present invention will now be described, by way of example, with reference to the accompanying drawings.

DETAILED DESCRIPTION

Figure 2:
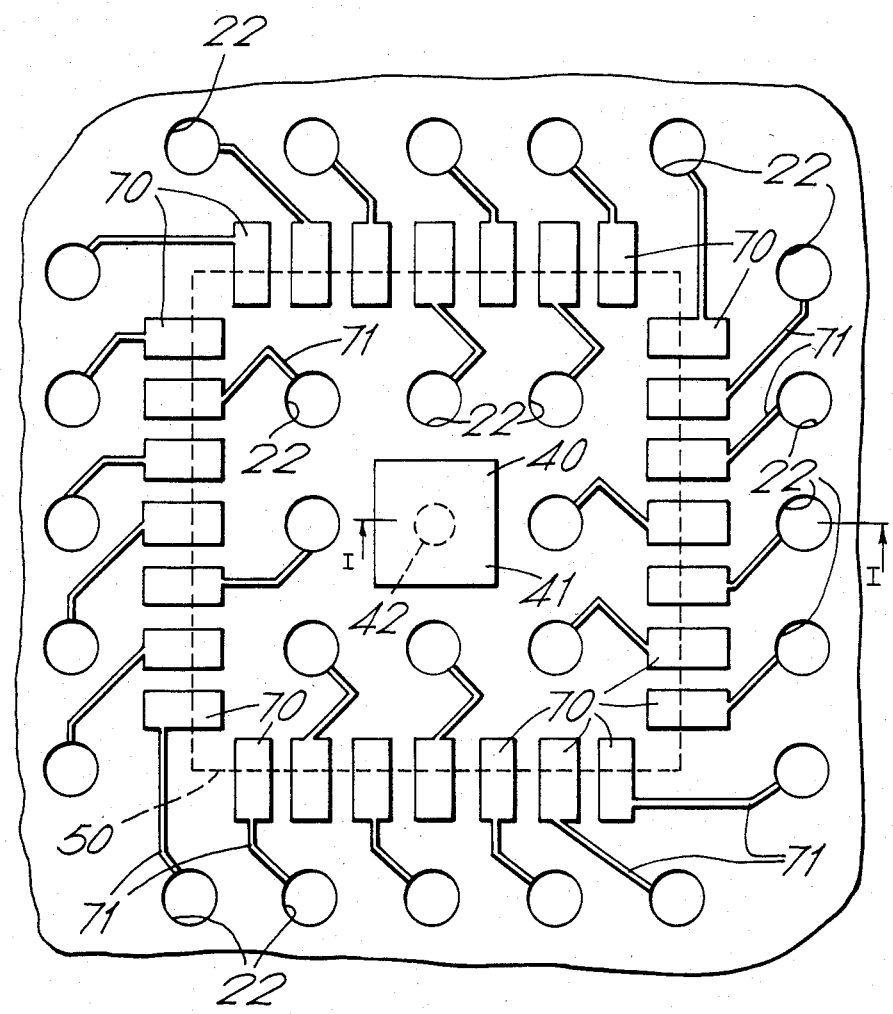
FIG. 2 is a plan view of the upper surface of the substrate.

The chip-carrier substrate is formed on a conventional multi-layer rigid or semi-rigid circuit board 1. The face of the board has a conductive surface layer 20 forming a pattern of electrical tracks (a part of which is shown in FIG. 2) to which individual chip carriers 50 are connected.

The board 1 comprises alternate layers of conductive and non-conductive/dielectric material. The conductive layers are connected with the surface layer and are laid down in tracks the geography of which establishes interconnection of the chip carriers and any other electronic components mounted on the board. Multi-layer boards of this kind are already well known. In the board of the present invention the non-conductive layers are of a glass-fibre and resin composite or a reinforced polyimide composite having a high glass-fibre content. Alternative materials that could be used include a Kevlar and resin composite (Kevlar is a Registered Trade Mark of DuPont), or Mycaply which includes quartz fibre (Mycaply is a Registered Trade Mark of the 3M Corporation).

On the top surface 2 and bottom surface 3 of the board 1 there are mounted respective layers 4 and 5 of copper-clad invar. These layers 4 and 5 comprise a core of invar that is coated with copper on opposite faces to improve bonding to the board 1, bonding of electrical components to the layers and hence thermal conduction. The invar in layers 4 and 5 modifies the overall thermal coefficient of expansion of the substrate. Boards using Kevlar or Mycaply as dielectric layers use the properties of those dielectric layers to control the substrates' overall thermal coefficient of expansion; in these boards the layers 4 and 5 are of copper.

Films 10 and 11 of elastomeric material are secured to the top and bottom surface respectively of the substrate, on top of the layers 4 and 5 of copper-clad invar. The films 10 and 11 may be of polyimide and are secured to the substrate by an acrylic adhesive—the elastomeric properties of the film are, in fact, contributed mainly by the adhesive rather than the film itself. Alternatively, the films 10 and 11 may be of, for example, butyl rubber, PTFE, or any suitable elastomer. On top of each film 10 and 11 there is a thin copper layer 20 and 21 respectively which may be formed on the film prior to it being laminated on the board, or added subsequently to lamination. Parts of the copper layers 20 and 21 are selectively removed to form a pattern of interconnections and pads in the manner described in greater detail below. The elastomeric layers 10 and 11 are formed with apertures enabling access to the underlying layers of copper-clad invar 4 and 5.

Figures 1, 3:
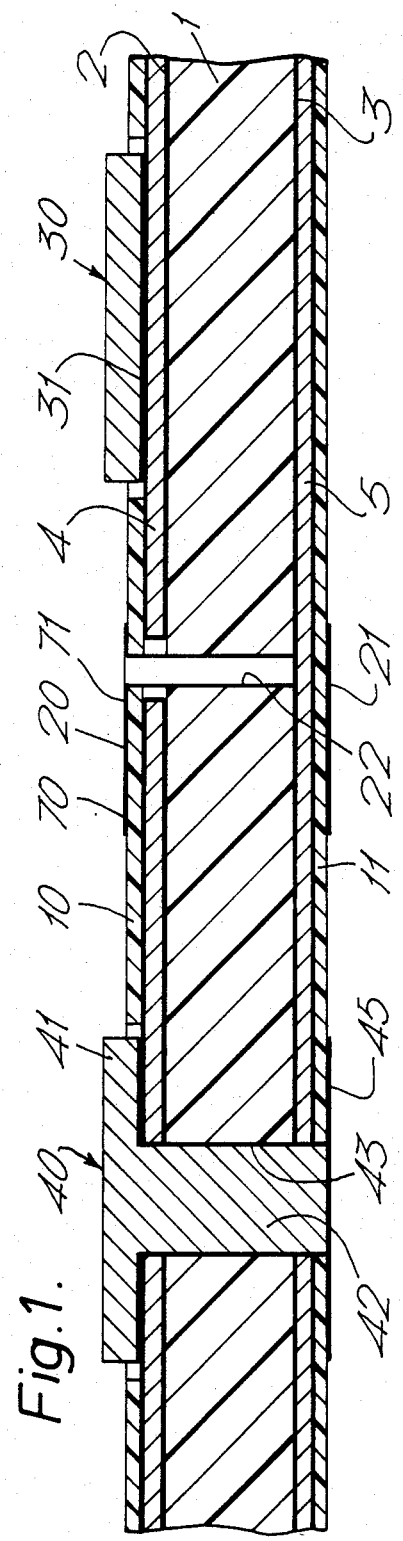
FIG. 1 is a simplified cross-sectional elevation through a part of the substrate along the line I—I of FIG. 2, showing its components schematically.
FIG. 3 is an enlarged cross-sectional elevation through a part of FIG. 1 but also showing a chip carrier mounted on the substrate.

Plated-through holes, such as the hole 22 shown in FIG. 1, interconnect the copper layers 20 and 21 to the desired electrically-conductive layers within the board 1.

Two different forms of heat-transfer pads 30 and 40 are shown in FIG. 1, these are located underlying, and in contact with, the chip carriers 50 (FIGS. 2 and 3). The pads 30 and 40 serve to conduct heat from the bottom surface of the carrier 50 to the substrate, and, more particularly, to the layers 4 and 5 of the substrate.

The pattern produced on the top surface of the substrate is shown in FIG. 2. The heat-transfer pad 40 is shown centrally of the pattern and is surrounded by twenty-eight contact pads 70 formed in the conductive layer 20. The pads 70 are of rectangular shape and are arranged to underlie the contact pads formed on the chip carrier 50. Each of the pads 70 is connected to a respective plated-through hole 22 by a narrow conductive track 71 (also formed in the layer 20) of dog-leg shape.

The pad 40 is used with chip carriers dissipating the greatest amount of heat. The pad 40 comprises a square head 41 integral with a heat-transfer pillar 42. The entire pad 40 is of solid copper and may be formed by chemical etching or by machining. The head 41 sits on the upper layer 4 in thermal contact with it, the thickness of the head being greater than that of the elastomeric layer 10 so that is projects above it. The pillar 42 is a solid cylindrical rod and extends downwardly from the head 41 within an aperture 43, completely through the layer 4, the board 1, the layer 5 and the elastomeric layer 11. The diameter of the aperture 43 is slightly greater than that of the pillar 42, the aperture being plated with a layer 44 of copper, as described in more detail below. At its lower end, the pillar 42 is connected with a copper pad 45 formed on the lower elastomeric layer 11.

Referring now more especially to FIG. 3, the pillar 42 and head 41 of the pad 40 are secured to the substrate by means of a layer of solder 46 (not shown in FIG. 1, for clarity) which fills the gap between the pillar 42 and the aperture 43 and also serves to connect the pillar to the lower pad 45. The copper layer 44 on the aperture 43 ensures that a good bond is formed between the pillar 42 and the substrate, while the copper coating of the layer 4 ensures that a good bond is formed between the head 41 and layer 4.

The pad 30 is used with smaller chip carriers or with those dissipating less heat, or when the cooling system employed does not require heat to be conducted to the reverse side of the substrate. The pad 30 is of copper and is of the same size and shape as the head 41 of the other pad 40, but lacks any heat-transfer pillar extending through the substrate. The pad 30 sits directly on the upper layer 4 being secured thereto by a thin layer 31 of solder.

The chip carrier 50 is of conventional leadless construction comprising a square carrier of alumina on which is mounted a twenty-eight input/output integrated electronic circuit or chip. Seven contact pads 51 are formed on each edge of the carrier 50 which are connected to the appropriate input or output lines on the chip. The thickness of the heat-transfer pad 40 ensures that the edges of the carrier 50 are raised above the substrate and, in particular, that contact pads 51 on the carrier are spaced above the contact pads 70 on the substrate. Interconnection of respective ones of the two sets of contact pads 70 and 51 is made by means of solder joints 53. Because of the separation between the two sets of contact pads 70 and 51 the solder is free to flow under the chip carrier 50 and forms a thick, compliant joint.

A chip carrier is mounted on the other heat-transfer pad 30 in a similar way.

The solder connection between the contact pads 70 and 51, and of the heat transfer pads 30 and 40 with the substrate, is preferably carried out by conventional reflow soldering techniques. During this technique the temperature of the substrate and carriers 50 are raised to cause a solder cream to melt and flow. As can be seen in FIG. 3, the capillary action of the solder between the contact pads 51 and 70 will be such as to draw the carrier 50 down to the substrate, whereas the solder between the under-side of the head 41 and top of the copper-clad invar layer 4 will tend to flow into the gap between the head and the substrate, thereby exerting a force to lift the pad 40. The combination of the upward force exerted by the pad 40 at the center of the carrier 50, and the downward forces exerted at the solder joints 53 around the edge of the carrier ensures that the carrier 50 is kept in intimate contact with the pad. This ensures that good thermal contact is always maintained.

The solder layer 31 between the underside of the pad 30 and the layer 4 acts in the same way, to improve heat transfer between a carrier mounted on the pad 30 and the substrate.

The materials and construction of the substrate have been selected to reduce the risk of high temperatures, temperature changes, or temperature gradients damaging the interconnection of the chip carriers with the substrate. It will be appreciated that, if the coefficient of thermal expansion of the materials forming the carrier and substrate differ, there will be differential expansion between them. Even, however, if the coefficients of expansion are closely matched there is still the risk of differential expansion because the components could be at different temperatures. This is a particular problem where the chip is dissipating a large amount of heat or where the assembly is subjected to rapidly changing ambient temperature. The elastomeric film 10 helps to accommodate any differential expansion of the carrier 50 relative to the board 1, in the plane of the board. The resilient nature of the film 10 allows the top layer 20, to which the edge of the carrier 50 is soldered, to move slightly relative to the underlying substrate. Although the plated-through holes 22 mechanically connect the top layer 20 with the underlying substrate, it will be appreciated, from FIG. 2, that the dog-leg shape of the conductive tracks 71 allows for movement of the pads 70, formed in the layer 20, towards or away from the plated-through holes 22. Movement of the carrier 50 relative to the substrate will be greatest along the diagonals of the carrier, because the greatest length of material lies in these directions; the angles of the dog-leg tracks 71 are selected to allow for this.

Heating of the carrier 50 and consequential expansion, is also reduced by the heat-transfer pads 30 and 40. The pads 30 and 40 conduct heat from the underside of the carrier 50 to a heat-conducting and heat-dissipating layer in the substrate. In the case of the pad 40 this heat dissipating layer is provided by the pad 45, by the bottom copper-clad invar layer 5 and by the top copper-clad invar layer 4. In the case of the other pad 30 heat is primarily dissipated through the top layer 4.

The heat-transfer pads 30 and 40 also serve an additional important function, which is, to raise the contact pads 51 on the carrier 50 above the contact pads 70 on the substrate, as mentioned above. This results in a considerably thicker solder joint than would be the case if the two sets of pads were in direct physical contact. It has been found that thick joints accommodate movement much more readily than thin joints because of the relatively flexible nature of the solder.

In order to reduce bending of the substrate caused by differential expansion of opposite faces in the plane of the substrate, the construction of the substrate is symmetrical as far as practical, on both sides. Thus, both the top and bottom faces have a substantially identical layer of copper-clad invar 4 and 5, and an elastomeric film 10 and 11. Also, the two conductive layers 20 and 21 are preferably of the same pattern, even though the pattern of tracks provided by the bottom layer may not be electrically interconnected. The layers within the board 1, are also preferably symmetrical about the thickness of the board.

The completed substrate can be mounted with its bottom face in contact with a heat-sink; a heat-conducting gasket may be sandwiched between the substrate and the heat sink to improve heat transfer. Alternatively, the substrate may be mounted with both faces exposed; cooling can be increased by blowing cold air across both faces.

The heat-transfer pillar need not be in the form of a solid rod. Instead, the equivalent heat transfer path through the substrate could be provided by several small-diameter holes, plates with copper, and filled with solder. A flat pad would be placed above the holes and thermally connected with them by causing the solder to flow.

What we claim is:

1. A chip-carrier substrate assembly comprising a chip-carrier substrate, a leadless chip carrier mounted on said substrate, said leadless chip carrier having a plurality of electrical contact pads spaced around its lower edge, said substrate including a substantially rigid multi-layer circuit board having electrical contact elements on its upper surface, solder joints electrically connecting said contact elements on said circuit board with respective ones of said electrical contact pads on said chip carrier, said substrate including at least one metal heat-dissipating layer, the chip-carrier substrate further including a metal pad with an upper surface and a lower surface, a layer of solder between the lower surface of said metal pad and the circuit board, said solder layer mounting said metal pad between said circuit board and the lower surface of said chip carrier, said metal pad being in thermal contact with both said heat-dissipating layer and the lower surface of the said leadless chip carrier, and the size and thickness of the said metal pad being such that the edges of said chip carrier overhang the metal pad and such that the contact pads on the chip carrier are spaced above the contact elements on the circuit board so as to increase the thickness of the said solder joint between the contact pads and the contact elements.

2. A chip-carrier substrate according to claim 1, wherein said heat-dissipating layer is on the upper side of the circuit board closer to the chip carrier.

3. A chip-carrier substrate according to claim 1, wherein said circuit board has an aperture therethrough, said pad including a heat-conducting pillar that extends within said aperture, said heat-dissipating layer being on the lower side of said board remote from the carrier, and said pillar being in thermal contact with said layer of heat-dissipating material.

4. A chip-carrier substrate according to claim 3, wherein said substrate includes a first heat-dissipating layer on the upper side of the board, a second heat-dissipating layer on the lower side of said board, said pad including a head portion of larger cross-section than said pillar, and said head portion being in thermal contact with said first layer.

5. A chip-carrier substrate according to claim 3, wherein said aperture through the board is coated with metal, and wherein a layer of solder is provided between said pillar and the metal coating.

6. A chip-carrier substrate according to claim 3, wherein said substrate includes a layer of elastomeric material, means mounting said layer of elastomeric material on the lower side of said substrate, a further heat-dissipating layer, and means mounting said further layer on the lower surface of said layer of elastomeric material, said pillar extending through said layer of elastomeric material and being in thermal contact with said further heat-dissipating layer.

7. A chip-carrier substrate according to claim 1, wherein said substrate includes a layer of elastomeric material, mounted on the upper side of the circuit board, closer to the carrier, a layer of electrically-conductive material, and means mounting said layer of electrically-conductive material on the upper surface of said elastomeric layer.

8. A chip-carrier substrate according to claim 7, wherein said substrate includes conductor elements rigidly mounted on said board, a layer of electrically-conductive material, said layer of electrically-conductive material including elongate tracks and the said contact elements to which the chip carrier is connected, said tracks extending from said contact elements to said conductor elements, and at least some of said tracks being bent in the plane of the substrate at a point along their length so as to accommodate displacement towards and away from said conductor elements.

9. A chip-carrier substrate according to claim 1, wherein said pad is of copper.

10. A chip-carrier substrate according to claim 1, wherein the metal heat-dissipating layer is of a copper-clad invar material.

11. A chip-carrier substrate according to claim 1, wherein said substrate is of symmetrical construction across its thickness, and wherein both the upper side and the lower side of said board have: a respective heat-dissipating layer, a respective layer of elastomeric material mounted on said respective heat-dissipating layer, and a respective layer of electrically-conductive material mounted on said respective elastomeric layer.

* * * * *